United States Patent
Sauerland

(10) Patent No.: US 6,710,613 B2
(45) Date of Patent: Mar. 23, 2004

(54) TEMPERATURE TEST SYSTEM WITH TEST RINGS CONCENTRIC WITH A CENTRIFUGAL FAN

(75) Inventor: Franz L. Sauerland, Chagrin Falls, OH (US)

(73) Assignee: Sansei Denshi Co., Ltd., Tokyo (JP)

( * ) Notice: Subject to any disclaimer, the term of this patent is extended or adjusted under 35 U.S.C. 154(b) by 0 days.

(21) Appl. No.: 10/102,436

(22) Filed: Mar. 19, 2002

(65) Prior Publication Data

US 2003/0179008 A1 Sep. 25, 2003

(51) Int. Cl.[7] ................................. G01R 31/02
(52) U.S. Cl. ........................ 324/760; 324/158.1
(58) Field of Search ..................... 324/73.1, 537, 324/754–758, 760–762, 158.1; 361/687, 695, 699

(56) References Cited

U.S. PATENT DOCUMENTS

| | | | |
|---|---|---|---|
| 5,451,884 A | | 9/1995 | Sauerland .................. 324/760 |
| 5,546,405 A | * | 8/1996 | Golla ......................... 324/754 |
| 5,859,540 A | * | 1/1999 | Fukumoto ................... 324/760 |
| 6,075,373 A | * | 6/2000 | Iino ............................. 324/754 |

* cited by examiner

Primary Examiner—Evan Pert
Assistant Examiner—Minh B. Tang
(74) Attorney, Agent, or Firm—Fay, Sharpe, Fagan, Minnich & McKee, LLP

(57) ABSTRACT

In FIGS. 5 and 7, a temperature chamber 4 encloses a centrifugal-fan wheel 8 that is mounted concentric with a test ring 2 such that the fan's radially expelled air, indicated by arrows 12, flows across the ring in parallel with the test ring surfaces and is circulated via heating/cooling elements back to the fan inlet. The test ring includes guide holes 36 and electronic components 32 with terminals 34. It can be rotated via a pin wheel 22 with drive pins 24 that engage in guide holes 36. A vertically mobile contact head 26 includes guide pins 28 and contact pins 42 that are connected with an external test instrument 51. Each time the ring is rotated a step, the contact head moves down to first engage guide pins 28 with the guide holes 36—thereby accurately aligning the contact pins 42 with the terminals 34—and, upon further down movement, connecting the contact pins 42 with terminals 34.

16 Claims, 14 Drawing Sheets

TEMPERATURE TEST SYSTEM WITH TEST RINGS CONCENTRIC WITH A CENTRIFUGAL FAN

BACKGROUND OF THE INVENTION

The present invention relates to the temperature testing of electronic components and, primarily, the testing of electronic quartz resonators, whose electrical parameters are temperature dependent. For testing, a batch of resonators is mounted in a temperature chamber and heated or cooled to a specific temperature. When the resonator response has settled, it is measured. The process is repeated at other predetermined temperatures. For the measurement a test instrument is switched sequentially to each resonator by either electrical or mechanical means.

FIGS. 1 and 2 give an example of prior art according to Reference 1. They show a plurality of components 1 supported on a flat test ring 3. Leads of each component are inserted in sockets 5 and 7. The sockets are connected with a first series of electrical contacts 9 on one side of the test ring and with a second series of electrical contacts 9 on the opposite face of the ring. The test ring is mounted in a chamber 15 on a turntable means 17 which is linked via shaft 19 to a step motor 21 outside the chamber. An electrical connection assembly includes a pair of wiper springs 23 that, upon stepwise rotation, can connect the component leads to an adapter network 25 (such as shown in FIG. 4) connected to a measurement instrument 27 outside the chamber.

A source of coolant 29 controlled by a valve 31 releases coolant, which is circulated by a fan 33 through a vertical, central inlet bore to the temperature chamber 15. A baffle 39 has an upper horizontal edge which directs the coolant through central apertures in the turntable 17 and test ring 3 and over the top of the ring, cooling the components before returning to fan 33. For temperatures higher than ambient, a heater 35 is used to heat the circulating air and thereby the components. The temperature is sensed by sensor 37.

The motor 21 indexes the series of electrical contacts 9, 11 associated with each of the components 1 into electrical contact with wiper springs. The contact springs are connected via adapter network 25 with test instrument 27.

Another disadvantage is a limited temperature uniformity. A paramount requirement for temperature test systems is temperature uniformity for all components, i.e. at all component locations. In this regard, the described system has an inherent limitation because the airflow generated by fan 33 is not concentric (symmetric) with test ring 1.

To overcome this problem, another prior-art system according to Reference 2 is claimed to have symmetric airflow. It is shown schematically in FIG. 3, including a temperature chamber 39, a cylindrical "test wheel" 41, and a "chamber base" 43 including "heater, coolant, fan, and insulation", providing an airflow indicated by arrows 45.

Both described systems require, in addition to the temperature chamber, housing for the generation, conditioning, and guidance of the circulating airflow. This means "wasted" space, energy, and time for heating and cooling the additional volume and apparatus.

Another disadvantage of both systems is limited measurement accuracy. This is explained by reference to FIG. 4, in which a test instrument 51 is connected to a resonator 53 via an "adapter network" 55 that includes several resistances and a "load capacitance" 57. High measurement accuracy requires that the length of the connection between resonator and adapter network be as short as possible. In both of the prior-art systems discussed above, this connection includes wiper contacts and wiper-terminals that connect to the resonator sockets. In contrast, the circuit according to the invention provides a direct, short (approximately 3 mm) connection from the adapter networks to the resonator terminals.

A further disadvantage of both described systems is the relative complexity of the thermal insulation, which has to conform to the outside of the cylindrical part of the chamber as well as to the rectangular housing for fan and heater, as shown in FIG. 1

SUMMARY OF THE INVENTION

The approach can be summarized by referring to FIGS. 5 and 7. FIG. 5 shows a cross section of a system according to the invention. FIGS. 7a and 7b is a cross section and top view, respectively, of a section of the system of FIG. 5. In both figures, a stepwise rotatable test ring 2 in a temperature chamber 4 includes guide holes 36 and electronic components 32 with terminals 34. It can be rotated by a step motor 20 via a pin wheel 22 with drive pins 24 that engage in guide holes 36. A vertically mobile contact head 26 includes guide pins 28 and contact pins 42. It can be moved up and down by a pneumatic solenoid 30. Each time the ring is rotated a step, the contact head moves down to first engage guide pins 28 with the guide holes 36—thereby accurately aligning the contact pins 42 with the terminals 34—and, upon further down movement, connecting the contact pins 42 with the terminals 34. Electrical measurements are made by a test instrument (not shown) that is connected to contact pins 42 via an adapter network 40. A centrifugal-fan wheel 8 is driven by a motor 10 and mounted concentric with test ring 2 so that the fan's radially expelled air, indicated by arrows 12, flows across the ring, in parallel with the test ring surfaces. Air guides 14 guide the airflow over the test ring and heating/cooling elements 16 back to fan inlet 18.

This approach overcomes the disadvantages of prior-art systems and provides:

1. low chamber volume and thermal mass, achieved by locating the test ring so it is concentrically surrounding the centrifugal fan.
2. high temperature uniformity in the temperature chamber, achieved by providing symmetric airflow in the chamber.
3. high accuracy for electrical measurement of the components, achieved by a short, direct connection between component and an adapter network.
4. precise alignment of the component's terminals with the contact pins, achieved by a re-alignment during each step of the test ring. High precision is essential because the dimensions of the component's terminals may be smaller than 0.5×0.5 mm.
5. high reliability and low cost, achieved by the simplicity of the design.
6. high thermal efficiency and simple application of thermal insulation, based on enclosing the system—including heater and fan—in one cylindrical housing.

BRIEF DESCRIPTION OF THE DRAWINGS

For a better understanding of the invention, reference is made to the following description taken in connection with the accompanying drawings.

DETAILED DESCRIPTION OF THE EMBODIMENTS

FIGS. 5, 6, 7a, and 7b show different views of a system according to the invention.

Figure 1:
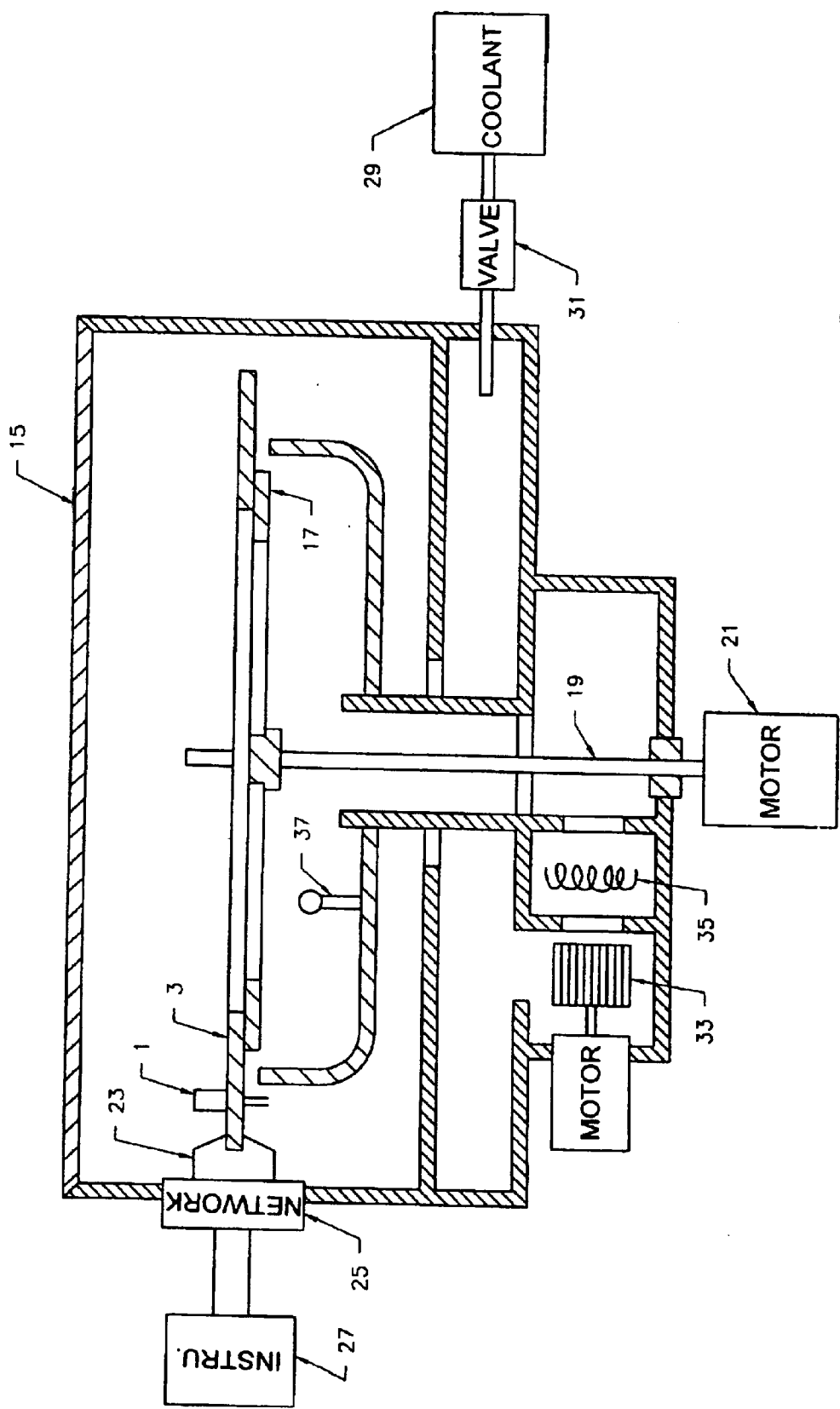
FIG. 1 shows a schematic cross section of a prior-art temperature test system.
Figure 2A:
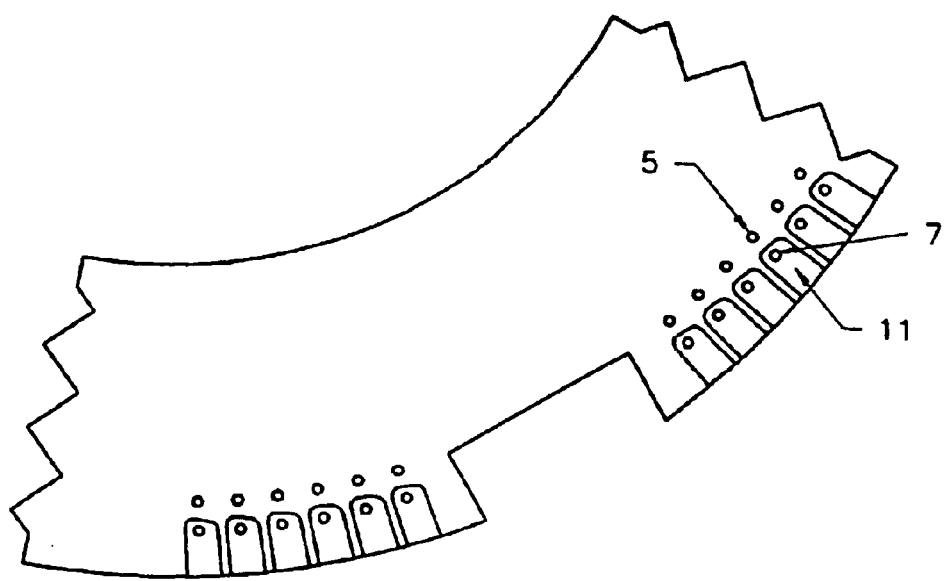
FIG. 2 shows top and bottom view, respectively of a section of a prior-art test ring.
Figure 2B:
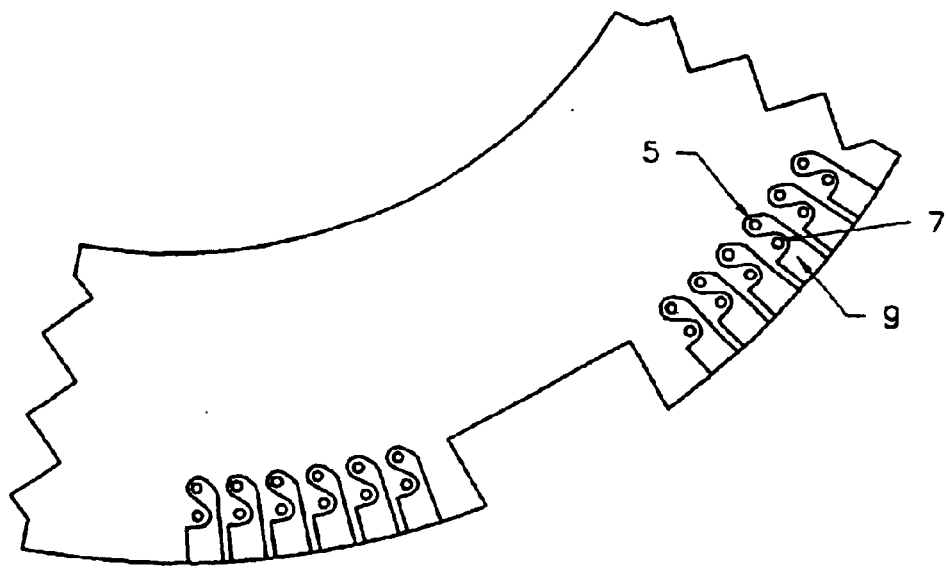
Figure 5:
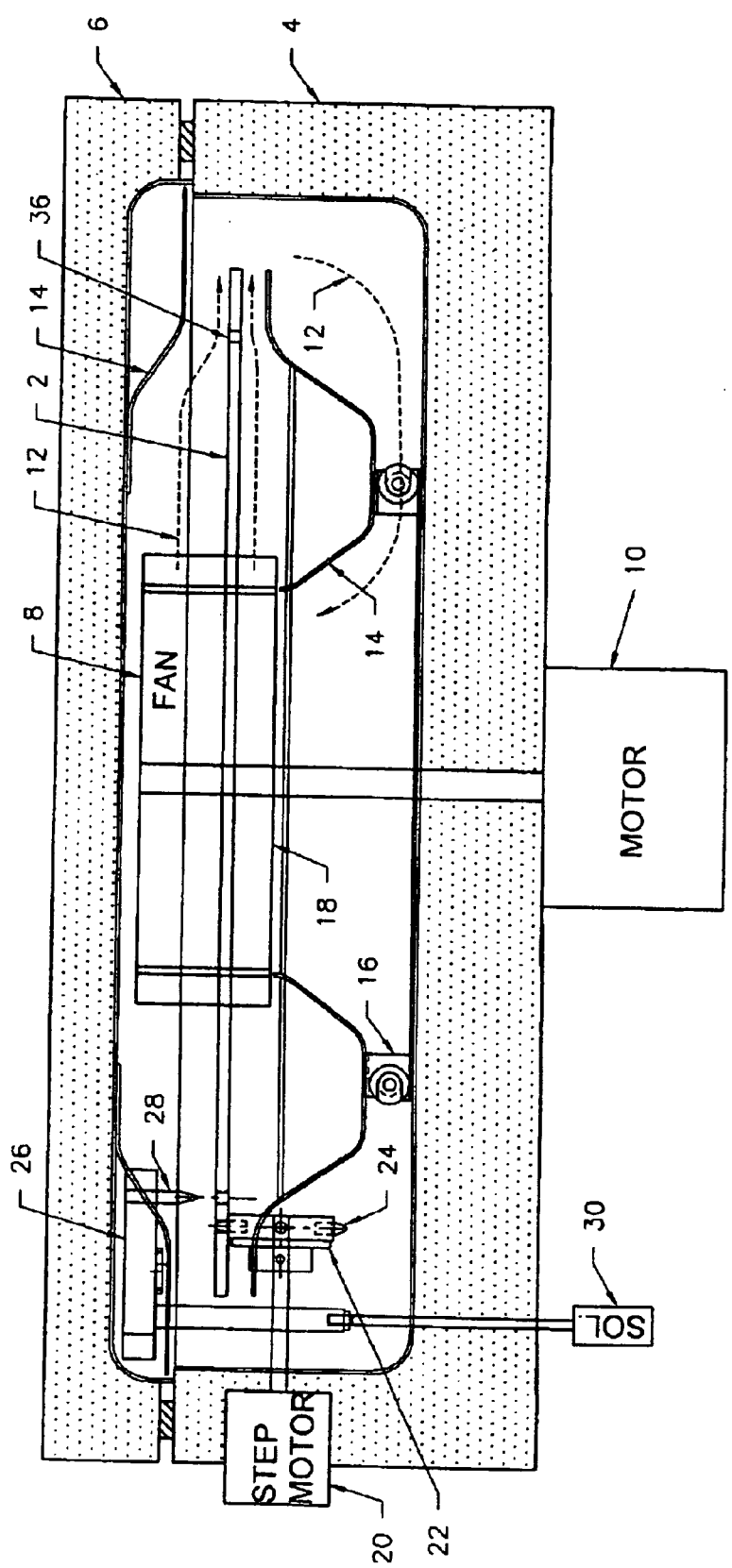
FIG. 5 is a cross section of a system according the invention.

FIG. 5 is a schematic cross section of the system. It includes a test ring 2 rotatably mounted in the center of a round chamber 4 with a lid cover 6. The test ring includes guide holes 36. A means for circulating air, such as a centrifugal fan wheel 8, is mounted concentric with the test ring and is driven by a motor 10. The fan expels air in a radial pattern parallel to the ring surface, creating a symmetric air flow that is guided by air guides 14 in the direction of dotted arrows 12 over the test ring surface and means for adjusting temperature in the form of heating/cooling elements 16 back to the fan inlet 18. The test ring can be rotated by a motor 20 via a pin wheel 22 with drive pins 24. A contact head 26, including guide pins 28, can be moved up and down by a pneumatic solenoid 30. Note that fan and heater are enclosed in the cylindrical chamber—in contrast with the prior-art system of FIG. 1, where fan and heater are enclosed in a separate housing attached to the cylindrical chamber. This results in reduced air volume, thermal mass, and cost for manufacturing and heat-insulating the chamber.

Figure 6:
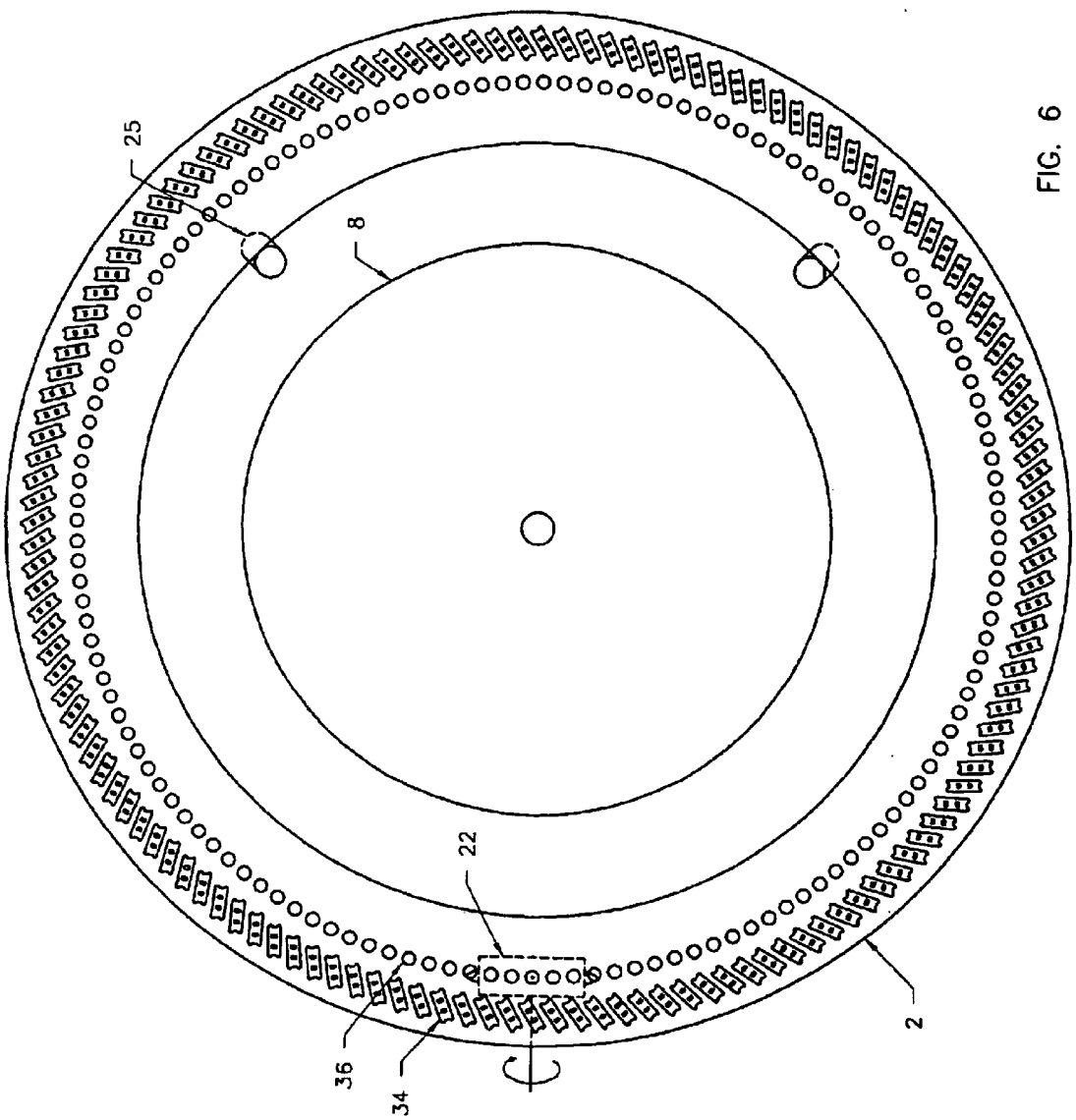
FIG. 6 is a top view of a test ring according to the invention.

FIG. 6 is a top view of test ring 2, fan wheel 8, drive wheel 22, and two supports 25 that are located at approx. 120 degrees from the pin wheel position. The test ring includes guide holes 36 and components (to be tested) 32 with terminals 34. It is supported by the drive wheel and two supports. This three-point support has two purposes: to keep the center of the test ring closely but not necessarily exactly at a fixed point, and to provide a solid mount for the test wheel even if its plane is not exactly perpendicular to the center axis of the system.

Figure 3:
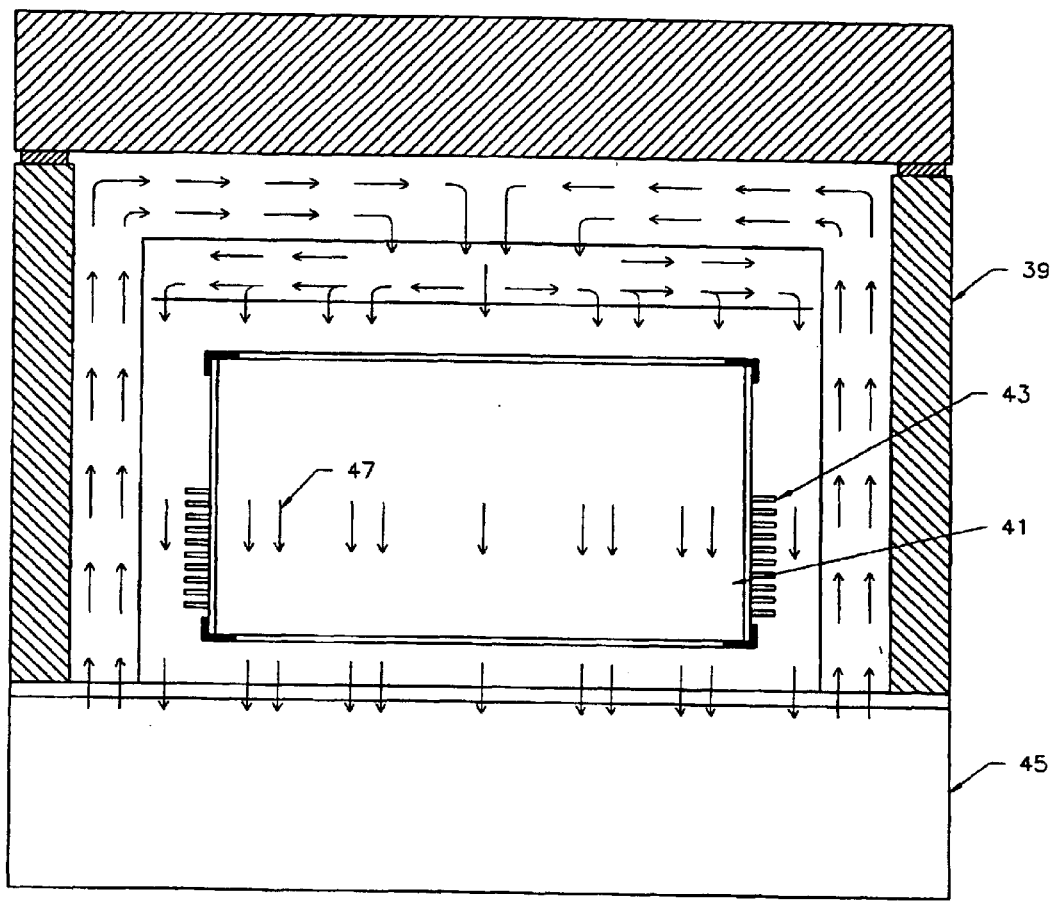
FIG. 3 is a schematic cross section of another prior-art test system.
Figure 4:
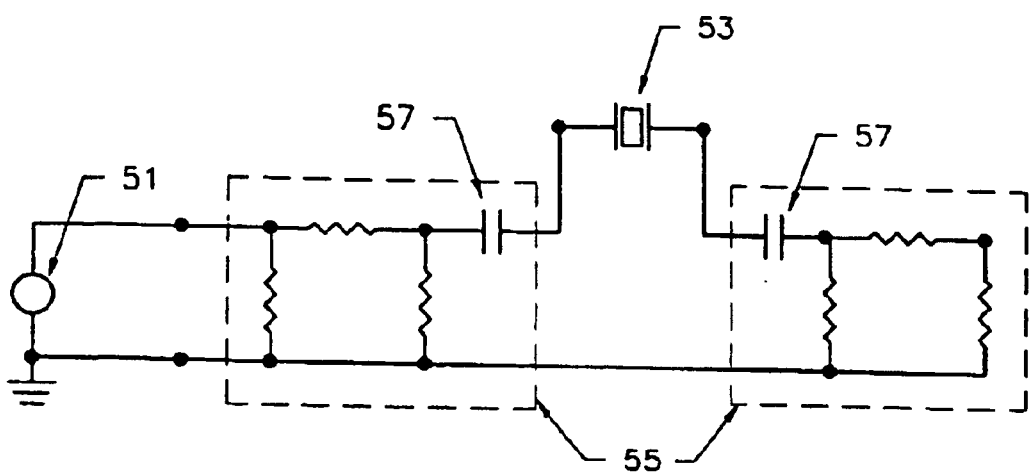
FIG. 4 shows a prior-art adapter network.
Figure 7A:
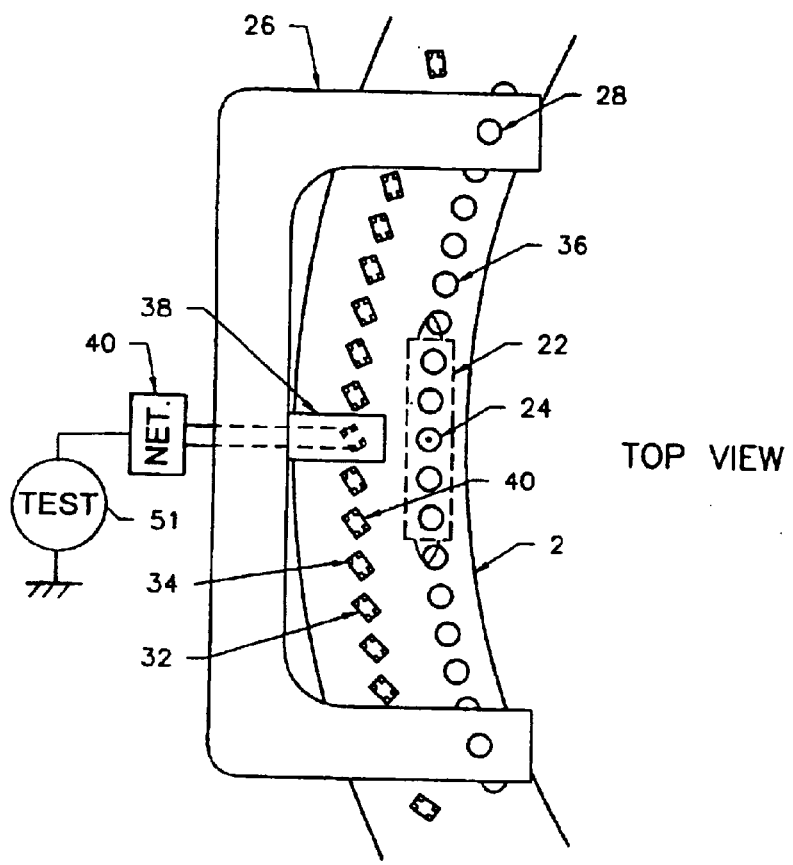
FIGS. 7a and 7b show a top view and sided view, respectively, of a section of a system according to the invention.
Figure 7B:
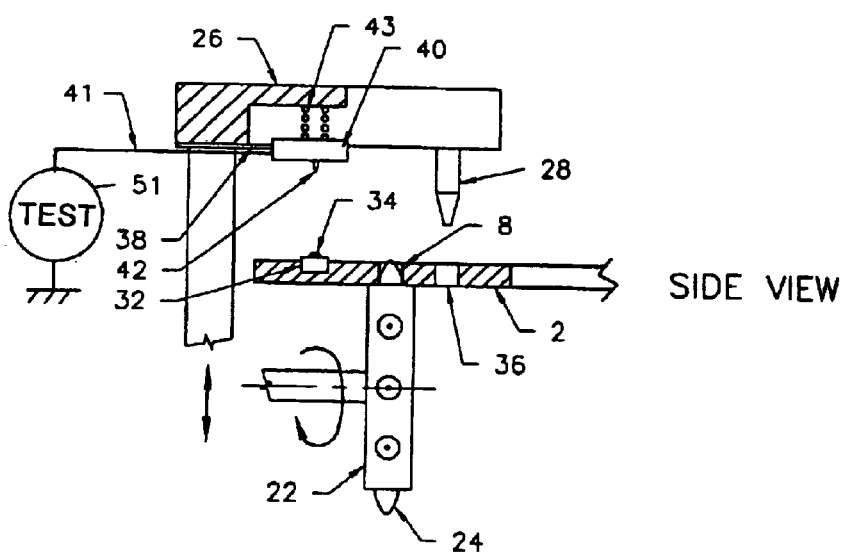

FIGS. 7a and 7b show a cross section and top view, respectively, of a section of the system. A test ring 2 includes guide holes 36 and components 32 with terminals 34. An adapter network with contact pins 42 is mounted on contact head 26 via a leaf spring 38. The adapter network can be of the type shown in (prior-art) FIG. 3. It is connected via a cable 41 to a test instrument 51 located outside the chamber. A spring 43 can be used for adding to the spring force of the leaf spring.

Both the pins of drive wheel 22 and the guide pins of contact head 26 can engage in the guide holes 36 to function as a means for step-wise rotating the test ring. The diameter of guide holes 36 is equal to that of guide pins but larger than that of drive wheel pins 24.

Figure 8:
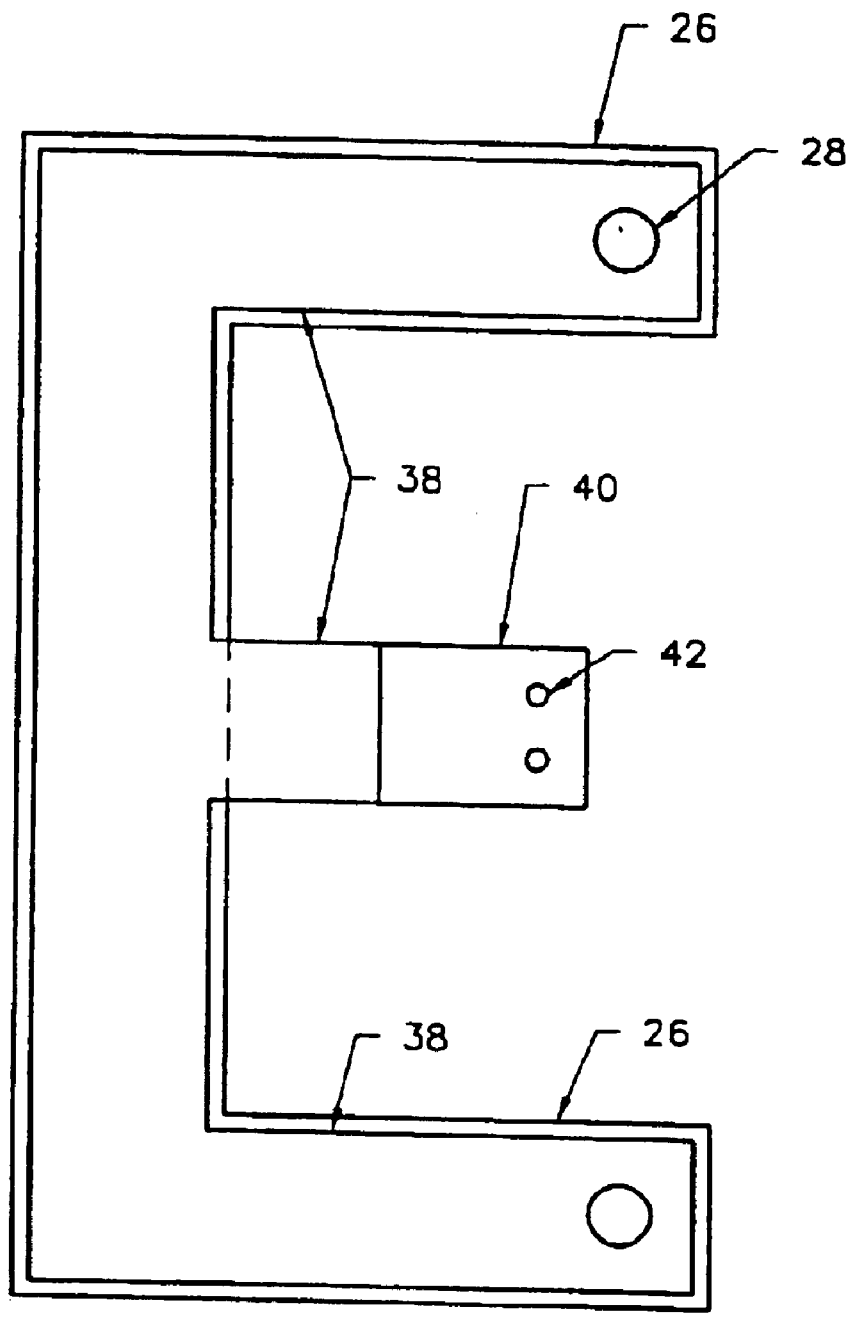
FIG. 8 is a bottom view of a contact head and leaf spring according to the invention.
Figure 14:
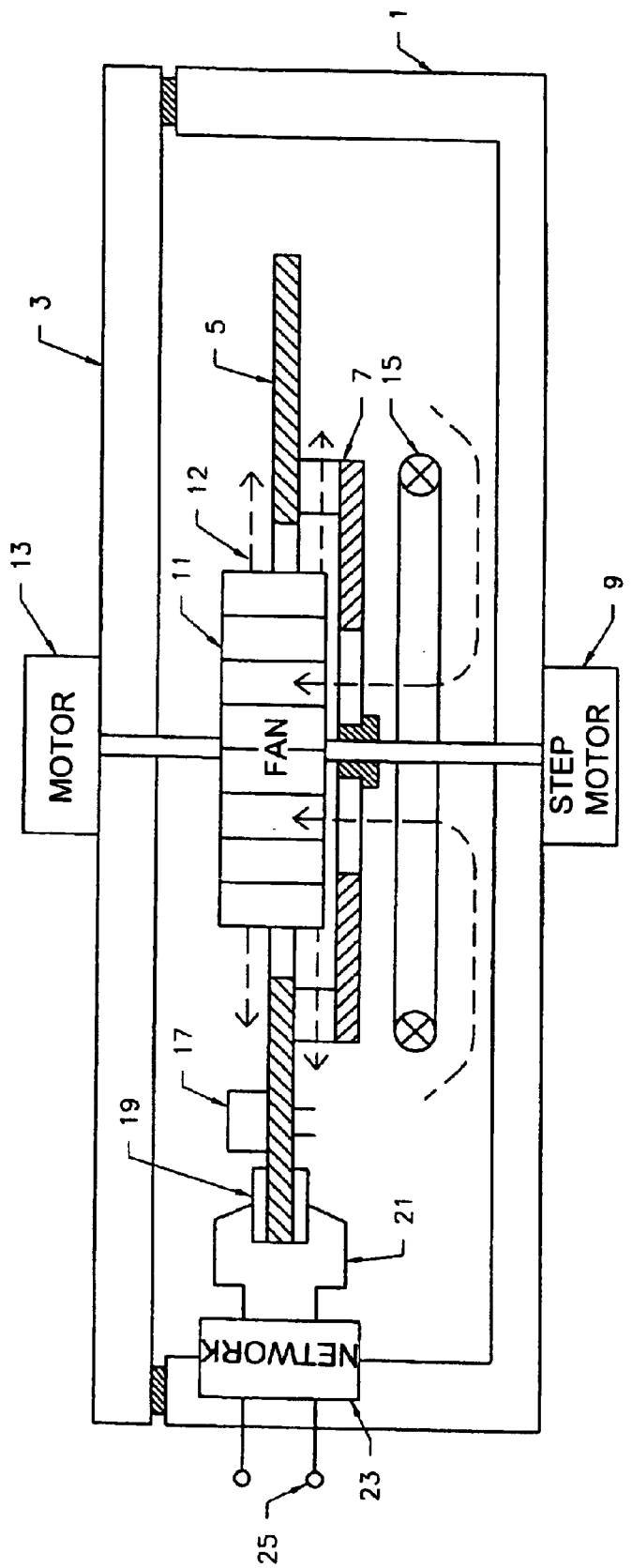
FIG. 14 is a cross section of another system according to the invention

Contact head 26 serves several functions on its downward move: first, to engage the guide pins with the guide holes, thereby precisely aligning the contact pins 42 with the terminals 34; then, upon further down movement, to provide spring force for connecting the contact pins with the terminals. The method of alignment can be further explained by reference to FIG. 8. It shows a bottom view of the contact head 26 of FIG. 6, including guide pins 28, leaf spring 38, adapter network 40, and contact pins 42. The leaf spring 38 is designed so the location of the contact pins 42 in reference to guide pins 28 is congruent with the location of guide holes 36 of FIG. 6 in reference to the terminals 34. As a result, the contact pins 42 are realigned with the terminals 34 each time the contact head is moved down. Note that the motion and alignment functions are emanating from and referenced to one "station"—in contrast to prior art systems, where the test wheel, controlled by a separate drive, constitutes a second "station" that needs to be exactly referenced to the first "station". This makes for less sensitivity to manufacturing tolerances—aside from the fact that concentrically driving both the fan and the test ring presents problems. One approach to that would be driving the fan from the top of the chamber and the test ring from the bottom of the chamber, as shown in FIG. 14.

To make a measurement, motor 20 of FIG. 5 moves test ring 2 via drive wheel 22 close (but not necessarily exactly) to a measurement position. Next, solenoid 30 moves contact head 26 down, thereby aligning terminals 34 with contact pins 42, and then, with further down movement, connecting the terminals with the contact pins. After the measurement the contact head is moved up, the test ring is rotated to the next measurement position, and the described process is repeated.

In FIG. 7b, the contact pins 42 are implied to be stiff pins, with the spring force for making contact being supplied by leaf spring 38 and spring 43. An alternate way is to use compressible contact pins, commercially known as "pogo" pins. In this case, leaf spring 38 would still be used for alignment, but spring 43 would be replaced by a fixed support block.

The heating/cooling elements 16 are normally separate elements. The heating element of the air temperatures adjusting means can consist of electrical heating wires. The cooling element can consist of heat exchange tubing connected to a cooling aggregate outside the chamber. Another approach is to inject a liquid refrigerant (e.g. liquid nitrogen or carbon dioxide) into the air stream.

The advantages of this approach can be summarized as follows:

1. low chamber volume and low thermal mass, achieved by locating a centrifugal fan wheel so it is concentrically surrounded by the test ring.

2. high temperature uniformity in the temperature chamber, achieved by providing symmetric airflow in the chamber.
3. high accuracy for the electric-parameter measurement of the components, achieved by a short direct connection between resonator and adapter network.
4. precise alignment of the component's terminals with the contact pins, achieved by a re-alignment during each step of the test ring. High precision is essential because the dimensions of the component's terminals may be smaller than 0.5×0.5 mm.
5. high reliability and low cost, achieved by the simplicity of the design that includes supporting the test wheel on three points and driving it tangentially via a pin wheel, such that the center of rotation of the test ring need not be fixed nor in exact relation to the contact pins.
6. high thermal efficiency and simple application of thermal insulation, based on packaging the system—including heater and fan—in one cylindrical housing.

Figure 9:
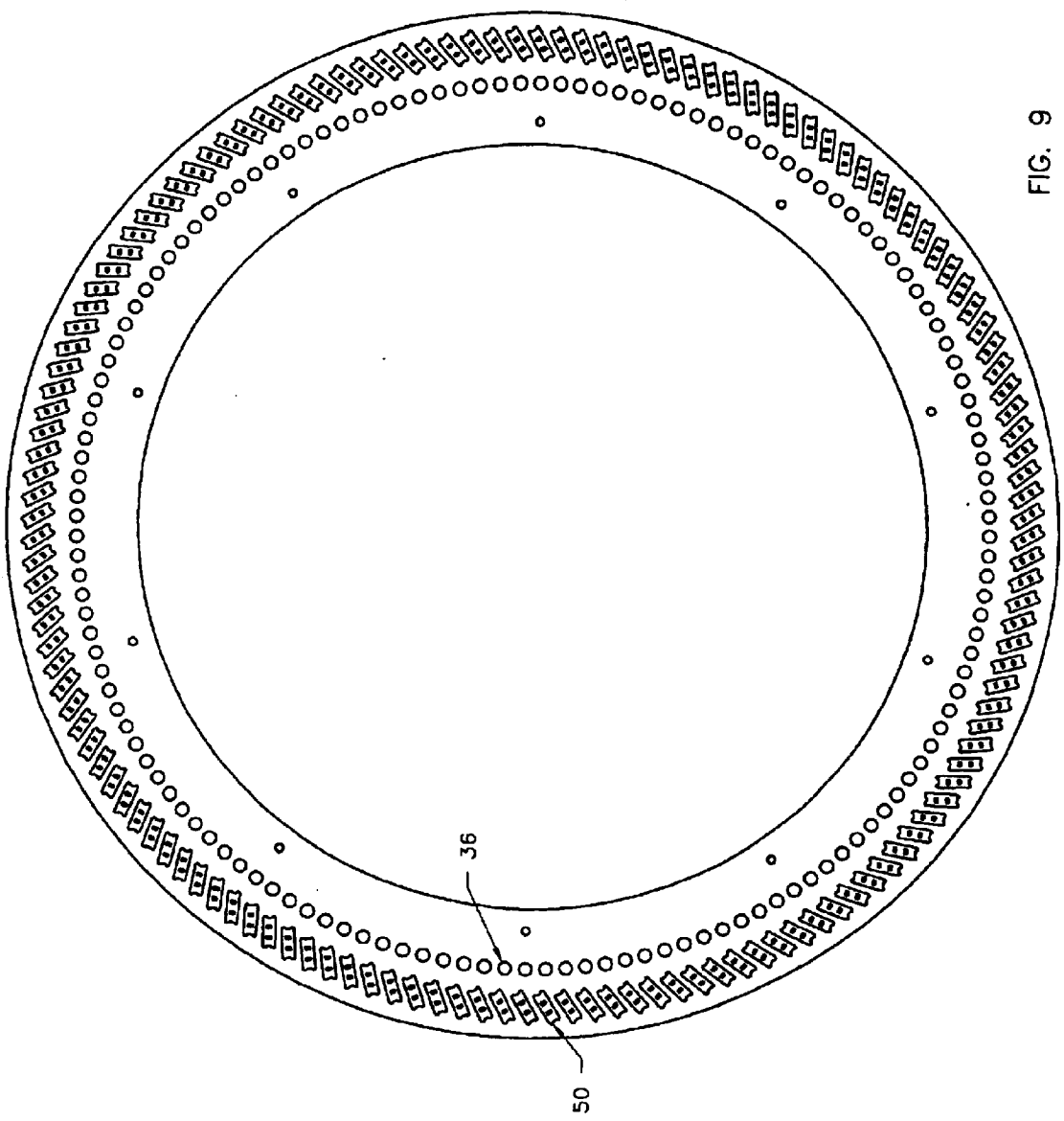
FIG. 9 is a top view of a prototype test ring according to the invention.
Figure 10:
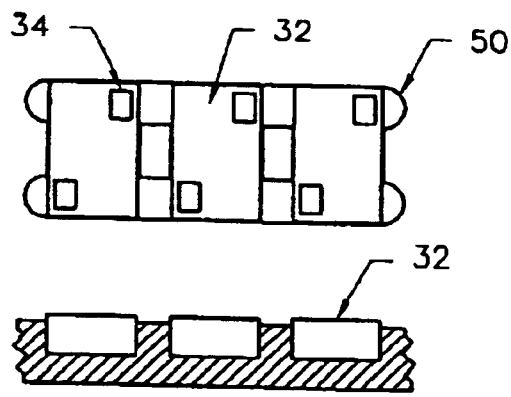
FIG. 10 shows top and side view, respectively, of three components in a pocket ot a prototype test ring according to the invention.
Figure 11:
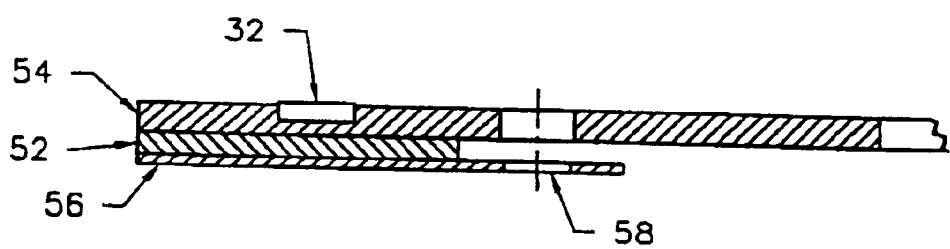
FIG. 11 is a cross section of a prototype test ring according to the invention.

A prototype system has been built for the electric-parameter test of quartz resonators. It holds 420 resonators on a test ring according to FIG. 6, with 140 guide holes 36 and 140 pockets 50 for three resonators each. FIG. 9 shows an enlarged top and cross sectional view of a pocket 50 including three resonators 32 with terminals 34. In operation, three resonators are contacted simultaneously with each step of the test wheel, then measured simultaneously or sequentially. To prevent a dislodging of the resonators due to air turbulence or accidental shock in handling, the test ring includes a magnetic layer 52—shown in FIG. 10—that aids in holding the components in place. Layer 52 is sandwiched between a plastic-material ring 54 holding components 32 and a stainless steel drive ring 56 with guide holes 58.

Figure 15:
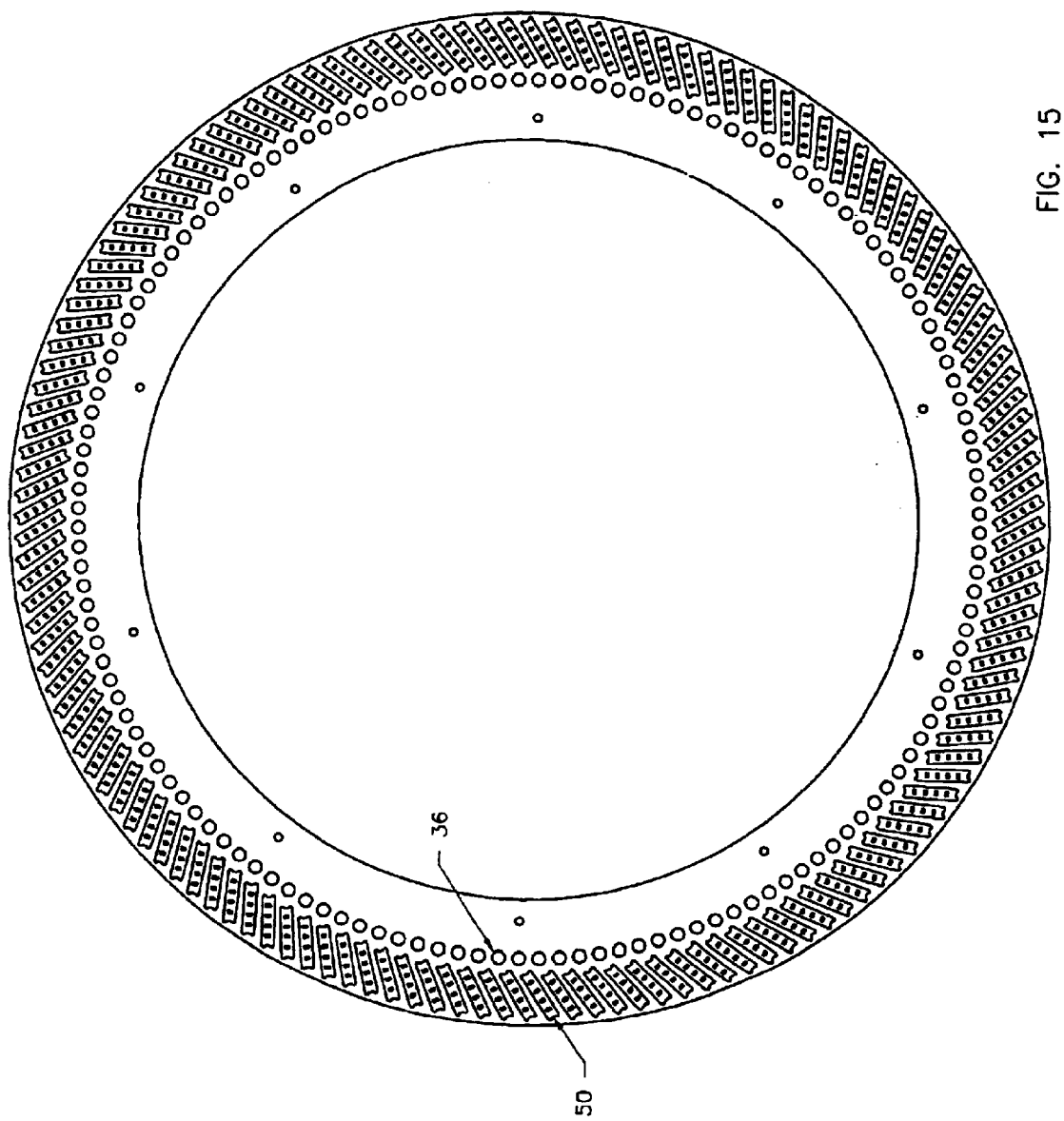
FIG. 15 shows a test ring holding 700 components.

The number of components per test system can be further increased by various means, including an increased density of resonators per test ring. As an example, FIG. 15 shows a test ring holding 700 components.

Figure 12:
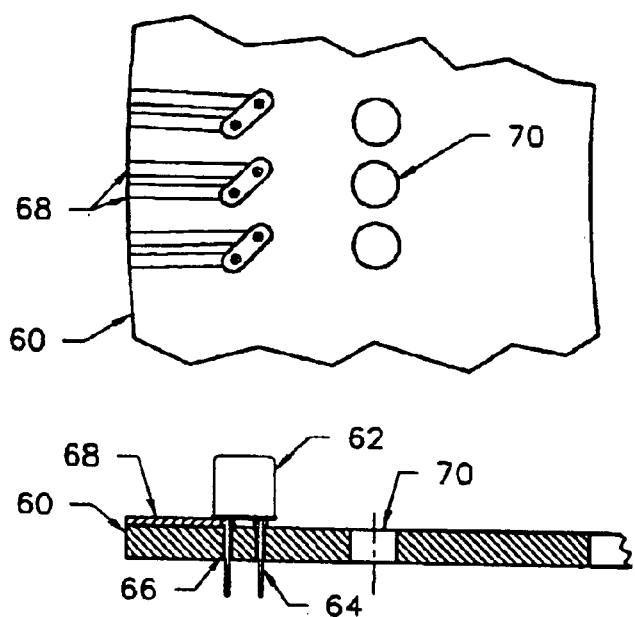
FIG. 12 shows a top and side view, respectively, of leaded components in a section of a test ring.

In the foregoing, the components have been made of the "SMD" (Surface Mount Devices) type—flat rectangular packages with flat contacts on one surface of the package. However, the approach according to the invention is also applicable to other component packages. Other means for mounting the electronic components are also contemplated. As an example, FIG. 12, shows a portion of a test ring 60 for "leaded" resonator packages that consist of a metal can 62 with contact leads 64. The leads are held in sockets 66 that are electrically connected to terminals 68. In operation, the test ring is contacted by contact pins (not shown) and is driven and aligned via guide holes 70.

Figure 13:
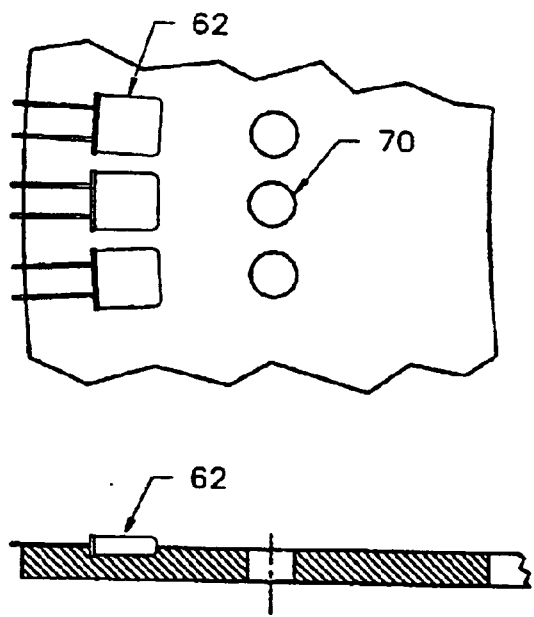
FIG. 13 shows another top and side view, respectively, of leaded components in a section of a test ring.

The length of the connection from the contact pins to the resonator terminals can be further minimized by an arrangement according to FIG. 13 in which the resonators and terminal leads lie flat in pockets of the test ring. Direct contact to the terminal leads can be made, according to the invention, by preferably using vertically mobile contact edges rather than contact pins.

The approach according to the invention can also be applied to components having more than two terminals, such as, for example, quartz oscillators. In this case the number of contact pins equals the number of terminals.

As explained before, the compactness of the described design is partly due to mounting the centrifugal fan wheel concentric with the test ring. This feature can be usefully employed even without the pin wheel drive. FIG. 14 shows an example. A chamber 1 with a lid 3 encloses a test ring 5 mounted on a turntable 7 driven by a motor 9. A centrifugal fan wheel 11 is mounted concentric with the test ring and is driven by a motor 13 mounted on the lid 3. The fan creates an air flow, indicated by arrows 12, that envelops heating/cooling elements 15. Leaded components 17 are connected to terminals 19 that are contacted by wiper contacts 21 connected via an adapter network 23 to outside terminals 25 for access to an external test instrument. As can be seen, the chamber is a cylinder that includes fan and heater, in contrast with prior art.

Figure 16:
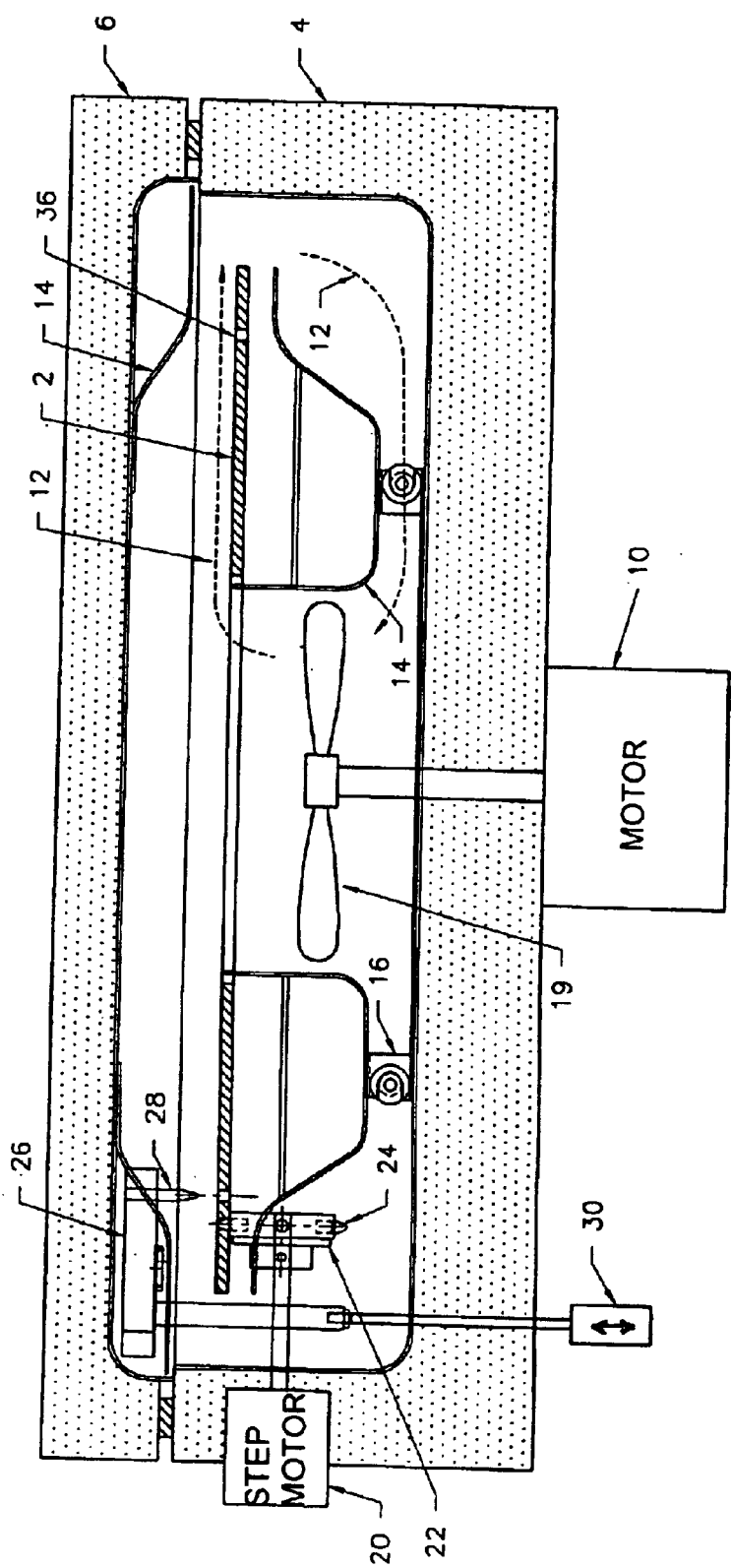
FIG. 16 is a cross section of another application of the invention.

As also explained before, the method of driving the test ring according to the invention entails advantages. They can be exploited even if the centrifugal fan is replaced by another type of fan. FIG. 16 shows an example. It includes all the elements shown in FIG. 5 except that the centrifugal fan has been replaced by an axial fan 19 to illustrate another example of the air circulating means.

The invention has been described with reference to the preferred embodiment. Obviously, modifications and alterations will occur to others upon reading and understanding the preceding detailed description. It is intended that the invention be construed as including all such modifications and alterations insofar as they come within the score of the appended claims or the equivalents thereof.

REFERENCES

1) "Electronic Component Temperature Test System with flat-ring revolving Carriage". U.S. Pat. No. 5,451,884.
2) "Model 6200 Temperature Test Chamber". Commercial data sheet (Approximate 1999) by PRA Inc.

What is claimed is:

1. A temperature-test system for electronic components with terminals, comprising a chamber including:
   - a stepwise rotatable test ring having guide holes, and holding said components along its periphery,
   - a fan mounted concentrically with the test ring so the fan's expelled air flows across at least one of the test ring surfaces,
   - a rotatably mounted drive wheel from which drive pins extend, the drive wheel being mounted such that the pins engage in said guide holes and rotate the test ring as the drive wheel rotates,
   - a vertically mobile contact head including contact pins and one or more guide pins mounted so that, upon lowering the contact head, the guide pins engage with said guide holes and the contact pins align and connect with said component terminals, and
   - an electrical connection from the contact pins to a test instrument outside the chamber.

2. The system according to claim 1 in which the chamber includes heating and cooling elements as well as air flow guide surfaces for guiding the air flow from the fan across the components in the test ring and across the heating and cooling elements back to the fan.

3. The system according to claim 1 in which the diameter of the guide holes is equal to that of the guide pins and larger than that of the drive pins, so that when the drive wheel steps the test ring to a new location, this location is close to but not necessarily exactly at a new measurement position, so that upon lowering the contact head, the guide pins engage with the guide holes, thereby moving the test ring exactly to the new measurement position and aligning the contact pins with the terminals, and, upon further lowering, the contact pins are connected with the terminals.

4. The system according to claim 1, in which the contact pins are pogo pins.

5. The system according to claim 1 in which the holding of the components along the test ring periphery is aided by permanent-magnet action.

6. The system according to claim 1 wherein the fan is a centrifugal fan that is surrounded by the test ring.

7. The system according to claim 1 wherein the fan is an axial fan which directs air through a central opening of the test ring.

8. The system according to claim 1 further including:
heating/cooling elements mounted concentrically with the test ring for heating and cooling the air circulated by the fan.

9. The system according to claim 8 further including:
an air guide for guiding air which has flowed across a surface of the test ring to circulate over the heating/cooling elements to the fan.

10. A temperature test system for electronic components with terminals, comprising a test chamber including:
a stepwise rotatable test ring having guide holes, and holding said components along its periphery,
an axial fan wheel, mounted concentrically with the test ring,
a drive wheel with drive pins, mounted so the pins can engage in said guide holes and rotate the test ring upon rotation of the drive wheel,
a vertically mobile contact head including contact pins and one or more guide pins mounted so that, upon lowering the contact head, the guide pins engage with said guide holes and the contact pins align and connect with said component terminals, and
an electrical connection from the contact pins to a test instrument outside the chamber.

11. A method for temperature-testing electronic components with terminals in a temperature chamber, comprising:
arranging the components, with the terminals accessible, on the periphery of a test ring that has guide holes and is supported on a drive wheel having drive pins engaging with the guide holes of the test ring,
mounting a contact head having guide pins as well as contact pins connected with a test instrument outside the chamber,
stepwise rotating the drive wheel and thereby the test ring, and lowering the contact head to engage the drive pins with the guide holes and connect the contact pins with the terminals, and
sequentially testing each component.

12. The method of claim 11, further circulating air over the test ring including the components, and over heating and cooling elements back to an inlet of an air circulation fan.

13. The method of claim 11 wherein the test ring is mounted on a turntable such that it concentrically surrounds a centrifugal-fan wheel.

14. A method for temperature-testing electronic components with terminals in a temperature chamber, comprising:
arranging the components, with the terminals accessible, on the periphery of a test ring that has guide holes and is supported on a drive wheel having drive pins that engage with the guide holes of the test ring,
mounting a contact head having guide pins as well as contact pins connected with a test instrument outside the chamber,
stepwise rotating the drive wheel and thereby the test ring, and lowering the contact head to engage the guide pins with the guide holes and connecting the contact pins with the terminals, and
sequentially testing each component.

15. A temperature test system for electronic components with terminals, the system comprising:
a test chamber;
an annular test ring rotatably mounted in the test chamber, the test ring including:
a means for mounting the electronic components to the test ring in electrical contact with electrical terminals,
guide holes for accurately positioning the test ring in preselected test positions;
a means for step-wise rotating the test ring to move the test ring roughly to each of the test positions;
a contact head including contacts for engaging the electrical terminals and guide pins which are received in the guide holes to lock the test ring accurately in one of the test positions while an electronic component is being tested;
a means for circulating air within the test chamber over the electronic components mounted to the test ring; and
heating/cooling elements for heating and cooling the circulated air.

16. The temperature test system for electronic components with terminals according to claim 15 wherein:
the air circulating means includes a centrifugal-fan wheel, concentrically surrounded by the test ring so the fan's radially expelled air flows across at least one of the test ring surfaces, and
the contact head is vertically mobile and the contacts include contact pins so that, upon lowering the contact head, the contact pins align and connect with said electrical terminals, and further including:
an electrical connection from the contact pins to a test instrument outside the chamber.

* * * * *